United States Patent

Hariton

[11] Patent Number: 5,920,232
[45] Date of Patent: Jul. 6, 1999

[54] COMPENSATED, BIAS-DEPENDENT SIGNAL FILTER AND AMPLIFIER CIRCUIT

[75] Inventor: Dan Ion Hariton, Pinole, Calif.

[73] Assignee: National Semiconductor Corporation, Santa Clara, Calif.

[21] Appl. No.: 09/096,915

[22] Filed: Jun. 12, 1998

[51] Int. Cl.$^6$ .................................................. H03F 3/04
[52] U.S. Cl. ............................................. 330/303; 330/306
[58] Field of Search .................................. 330/302, 303, 330/306, 288

[56] References Cited

U.S. PATENT DOCUMENTS

| | | | |
|---|---|---|---|
| 4,843,343 | 6/1989 | Pace | 330/306 |
| 5,241,284 | 8/1993 | Nyqvist et al. | 330/303 |
| 5,412,335 | 5/1995 | Jackson et al. | 330/306 |
| 5,666,086 | 9/1997 | Klein | 330/306 |

*Primary Examiner*—Robert Pascal
*Assistant Examiner*—Patricia Nguyen
*Attorney, Agent, or Firm*—Limbach & Limbach L.L.P.

[57] ABSTRACT

A compensated, bias-dependent signal filtration and amplification circuit includes a low-pass RC filter with a bias-dependent frequency response caused by the use of MOS transistors connected as capacitors with bias-dependent capacitances. A dc current source is used, in cooperation with the resistors of the RC filter, to generate a fixed bias for the capacitor-connected MOS transistors and thereby eliminate the bias dependencies of the capacitances. Following amplification of the filtered signal, another dc current is subtracted out from the amplified output signal so as to eliminate any residual dc signal components due to the input compensation dc bias signal, thereby leaving only the amplified filtered ac signal components.

28 Claims, 2 Drawing Sheets

COMPENSATED, BIAS-DEPENDENT SIGNAL FILTER AND AMPLIFIER CIRCUIT

BACKGROUND OF THE INVENTION

1. Field of the Invention

The present invention relates to filter and amplifier circuits for current signals, and in particular, to filter and amplifier circuits for current signals which use resistive-capacitive (RC), low-pass filter circuits implemented in integrated circuit (IC) form.

2. Description of the Related Art

In many circuits involving mixed signals (i.e., analog plus digital), it is often to necessary to include filter circuits to prevent switching noise or higher order signal frequency components from the digital signals from affecting the analog signals. This is particularly true for ICs which are processing both analog and digital circuits on one chip.

As ICs have become larger and more complex, the need for including filter circuits has grown greater due to the proximity of analog and digital circuits and signal lines, as well as the use of shared power supply lines within the chip. One of the simpler types of filter circuits used is a low-pass filter circuit which relys on resistors and capacitors. An implementation of an RC-type low-pass filter is typically done in one of two ways. One technique is to provide terminals for connecting external capacitors to the chip. However, this technique requires dedicated terminals for connecting the external capacitors. For many complex ICs, this is unacceptable due to the limited number of external pins or other terminals available for a particular size of IC package. The second technique involves the implementation of the filter using on-chip integrated components. For example, it is well know to use a metal oxide semiconductor field effect transistor (MOSFET), with its drain, source and substrate terminals all connected together, as a capacitor.

Referring to FIG. 3, however, using a MOS transistor as a capacitor requires that some form of stable voltage bias be provided to as to establish and stabilize the capacitance value C of such capacitor. For example, to maintain operation of the MOS transistor in its depletion mode, the drain/source/substrate terminal must be biased positively with respect to its gate terminal with a DC bias voltage Von which is greater than the transistor threshold voltage Vt. Alternatively, the DC bias voltage Von must be maintained at a negative value less than zero volts at the gate terminal with respect to the drain/source/substrate terminal to maintain operation in the accumulation mode.

Further, once the capacitance value has been stabilized in this manner, it must be maintained under signal conditions. Accordingly, it becomes necessary to combine the input AC signal with the DC biasing signal, thereby resulting in an output signal which contains both AC and DC components. However, this is generally undesired and it often becomes necessary to then somehow remove the DC signal component from the output signal.

Accordingly, it would be desirable to have a simple and reliable technique whereby on-chip integrated components can be used to implement an RC-type filter having stabilized values of capacitance while being capable of amplifying an AC input signal and providing a corresponding AC output signal with no DC components corresponding to any internal DC biasing signal.

SUMMARY OF THE INVENTION

In accordance with the present invention, a compensated, bias-dependent signal filter and amplifier circuit can be implemented using on-chip integrated components for the capacitors while maintaining the capacitive filter components at their desired values throughout the full range of the AC input and output signals.

In accordance with one embodiment of the present invention, a compensated, bias-dependent signal filtration and amplification circuit includes a filter circuit and an amplifier circuit. The filter circuit has a bias-dependent frequency response and is configured to receive an input dc bias signal having a first dc magnitude and in accordance therewith receive and filter an input ac signal and in accordance therewith provide a filtered signal. The bias-dependent frequency response remains substantially fixed in accordance with the dc bias signal. The filtered signal includes an input dc signal component which corresponds to the input dc bias signal, and a filtered ac signal component which corresponds to the input ac signal. The amplifier circuit is configured to receive an output dc bias signal having a second dc magnitude which is proportional to the first dc magnitude, receive and amplify the filtered signal and subtract the output dc bias signal from the amplified filtered signal and in accordance therewith provide an output signal. The output signal includes an output ac signal component which corresponds and is proportional to the input ac signal, and substantially zero output dc signal components which correspond to the input and output dc bias signals.

In accordance with another embodiment of the present invention, an integrated circuit for implementing a compensated, bias-dependent signal filtration and amplification circuit includes a semiconductor substrate, circuit terminals, at least one capacitive circuit element and an amplifier circuit. The circuit terminals are configured to be connected to one or more external circuit elements. The capacitive circuit element(s) is(are) integrated within the semiconductor substrate, has(have) bias-dependent capacitance(s), is(are) coupled to one or more of the circuit terminals and is(are) configured to receive an input dc bias signal having a first dc magnitude and in accordance therewith and in cooperation with the one or more external circuit elements receive and filter an input ac signal and in accordance therewith provide a filtered signal. The bias-dependent capacitance(s) remain(s) substantially fixed in accordance with the dc bias signal. The filtered signal includes an input dc signal component which corresponds to the input dc bias signal, and a filtered ac signal component which corresponds to the input ac signal. The amplifier circuit is integrated within the semiconductor substrate and is configured to receive an output dc bias signal having a second dc magnitude which is proportional to the first dc magnitude, receive and amplify the filtered signal and subtract the output dc bias signal from the amplified filtered signal and in accordance therewith provide an output signal. The output signal includes an output ac signal component which corresponds and is proportional to the input ac signal, and substantially zero output dc signal components which correspond to the input and output dc bias signals.

In accordance with still another embodiment of the present invention, a method of performing compensated, bias-dependent signal filtration and amplification includes the steps of:

receiving an input dc bias signal having a first dc magnitude;

receiving an input ac signal;

filtering the input ac signal in accordance with a frequency response and in accordance therewith generating a filtered signal, wherein the frequency response is substantially fixed in accordance with the input dc bias signal, and wherein the filtered signal includes an input dc signal component which corresponds to the input dc bias signal, and a filtered ac signal component which corresponds to the input ac signal;

receiving an output dc bias signal having a second dc magnitude which is proportional to the first dc magnitude; and amplifying the filtered signal and in accordance therewith generating an amplified filtered signal; and subtracting the output dc bias signal from the amplified filtered signal and in accordance therewith generating an output signal, wherein the output signal includes an output ac signal component which corresponds and is proportional to the input ac signal, and substantially zero output dc signal components which correspond to the input and output dc bias signals.

These and other features and advantages of the present invention will be understood upon consideration of the following detailed description of the invention and the accompanying drawings.

DETAILED DESCRIPTION OF THE INVENTION

Figure 1:
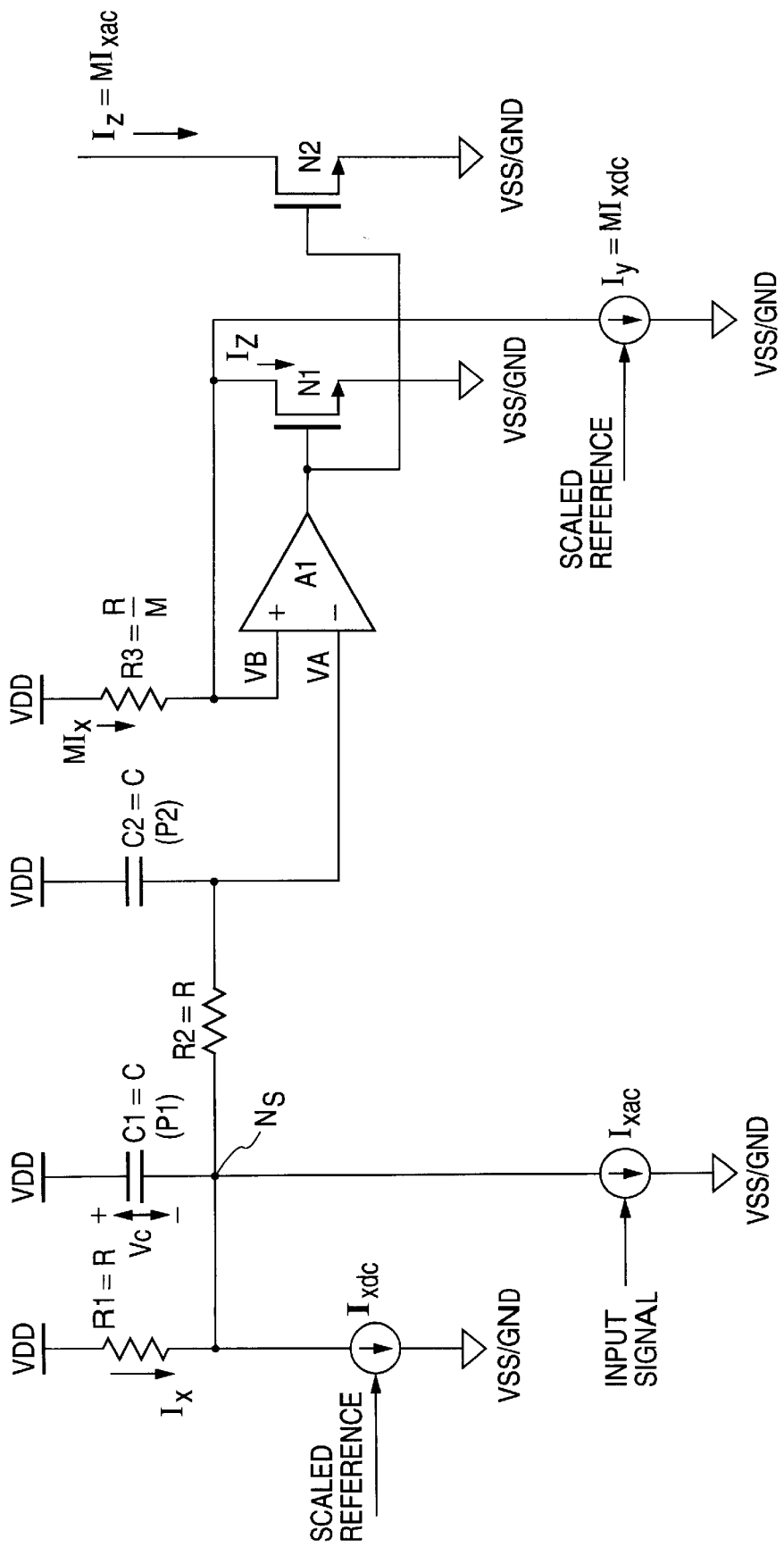
FIG. 1 is a simplified schematic diagram of a compensated, bias-dependent signal filter and amplifier circuit in accordance with one embodiment of the present invention.
Figure 2:
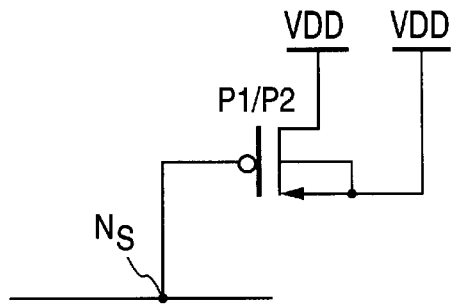
FIG. 2 is a schematic diagram of the connections for a P-type MOSFET connected as a capacitor for use in the circuit of FIG. 1.

Referring to FIG. 1, a compensated, bias-dependent signal filter and amplifier circuit in accordance with one embodiment of the present invention includes an RC low-pass filter circuit and an amplifier circuit which functions as a current mirror. The filter circuit includes input shunt resistor R1 and capacitor C1, series resistor R2 and output shunt capacitor C2, interconnected substantially as shown. These two RC pairs, R1/C1 and R2/C2, create a double-pole low-pass filter. Referring to FIG. 2, capacitors C1 and C2 are implemented as P-type MOSFETs operating in depletion mode. The input node Ns performs as a summing node for two input current signals Ixdc, Ixac.

Figure 3:
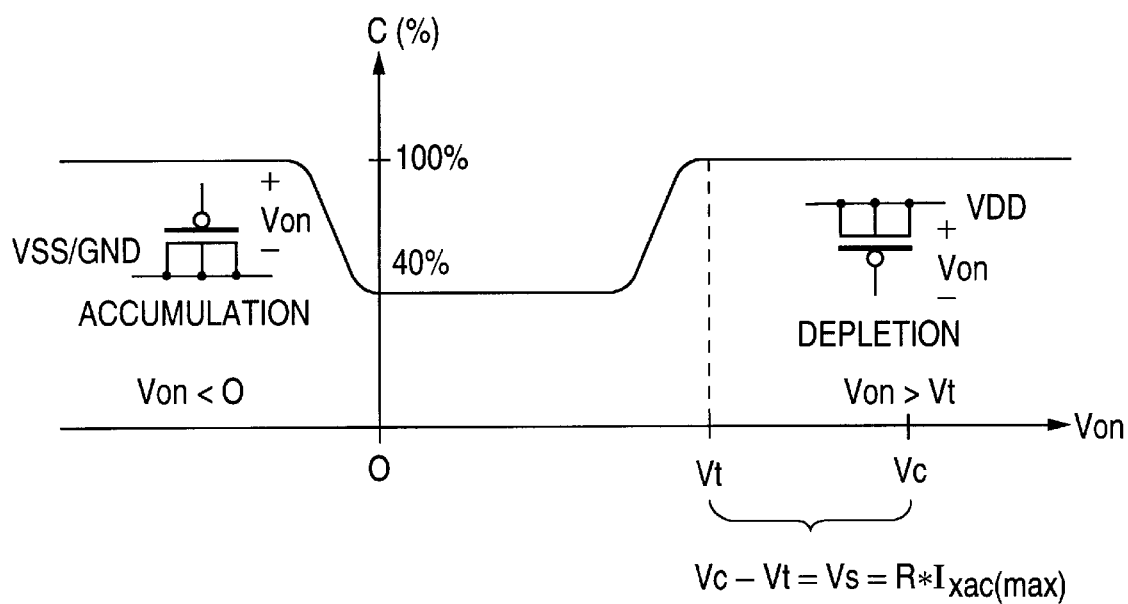
FIG. 3 is graph of capacitance versus bias voltage for a P-type MOSFET connected as a capacitor.

Referring to FIG. 3, using MOSFETs as capacitors requires that a permanent DC bias voltage be applied across each device so as to maintain its full capacitance value, even in the absence of an input signal. The current Ix through resistor R1 includes a fixed DC component due to the DC input current Ixdc, as well as a variable AC component due to the input signal current Ixac. Hence, the total bias voltage for the P-MOSFET capacitors is developed in accordance with the DC Ixdc and AC Ixac currents through resistor R1. This produces a DC bias voltage VC (R1*Ixdc+R1*Ixac) across capacitor C1, as well across capacitor C2 (due to the negligible current flow into the inverting input terminal of amplifier A1).

The input signal current Ixac, which is modulated in accordance with the AC input signal is low-pass filtered to produce voltage VA at the inverting terminal of operational amplifier (op-amp) A1. Input voltage VB at the non-inverting terminal of op-amp A1 is produced by current MIx through resistor R3. This differential voltage VB-VA produces an op-amp output voltage which drives N-type MOSFETs N1 and N2. A DC output current Iy, which is a multiple M of the DC input current Ixdc (Iy=MIxdc), is subtracted from the current MIx through resistor R3, thereby producing current Iz (=MIx−Iy) through transistor N1 which, in turn, is mirrored to produce the output current Iz through transistor N2. Hence, the output current Iz is equal to the multiple M times the input signal current Ixac.

The input AC signal current Ixac, due to its modulation by the input signal, must be appropriately scaled so as to prevent it from increasing the voltage at the summing node Ns to the point where the MOSFET capacitance voltage VC decreases in amplitude below the threshold voltage Vt of the MOS device. Alteratively, the DC input current Ixdc can be scaled in accordance with a scaled reference so as to ensure that the overall bias current Ix (=Ixdc+Ixac) produces a sufficiently high biasing voltage VC for the MOS devices. Of course, so as to maintain the overall scaling of the circuit, the DC output current Iy must also be scaled in accordance with the same scaled reference.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a compensated, bias-dependent signal filtration and amplification circuit, comprising:

a filter circuit having a bias-dependent frequency response and configured to receive an input dc bias signal having a first dc magnitude and in accordance therewith receive and filter an input ac signal and in accordance therewith provide a filtered signal, wherein said bias-dependent frequency response remains substantially fixed in accordance with said dc bias signal, and said filtered signal includes an input dc signal component which corresponds to said input dc bias signal, and a filtered ac signal component which corresponds to said input ac signal; and an amplifier circuit, coupled to said filter circuit, configured to receive an output dc bias signal having a second dc magnitude which is proportional to said first dc magnitude, receive and amplify said filtered signal and subtract said output dc bias signal from said amplified filtered signal and in accordance therewith provide an output signal, wherein said output signal includes an output ac signal component which corresponds and is proportional to said input ac signal, and substantially zero output dc signal components which correspond to said input and output dc bias signals.

2. The apparatus of claim 1, wherein said filter circuit and said amplifier circuit together comprise a current mirror circuit.

3. The apparatus of claim 1, wherein said input dc bias signal comprises a dc current.

4. The apparatus of claim 1, wherein said filter circuit comprises a low-pass filter circuit.

5. The apparatus of claim 4, wherein said low-pass filter circuit is an RC filter circuit and comprises a semiconductor substrate and at least one capacitive circuit element integrated within said semiconductor substrate.

6. The apparatus of claim 1, wherein said output dc bias signal comprises a dc current.

7. The apparatus of claim 1, wherein said amplifier circuit comprises a differential amplifier.

8. The apparatus of claim 1, wherein said output signal comprises an ac current.

9. The apparatus of claim 1, further comprising:

an input dc current source, coupled to said filter circuit, configured to provide an input dc current as said input dc bias signal; and an output dc current source, coupled to said amplifier circuit, configured to provide an output dc current as said output dc bias signal.

10. The apparatus of claim 1, further comprising an ac current source, coupled to said filter circuit, configured to provide an ac current as said input ac signal.

11. An apparatus including an integrated circuit for implementing a compensated, bias-dependent signal filtration and amplification circuit, comprising:

a semiconductor substrate;

a plurality of circuit terminals configured to be connected to one or more external circuit elements;

at least one capacitive circuit element, integrated within said semiconductor substrate, having at least one bias-dependent capacitance and coupled to one or more of said plurality of circuit terminals, configured to receive an input dc bias signal having a first dc magnitude and in accordance therewith and in cooperation with said one or more external circuit elements receive and filter an input ac signal and in accordance therewith provide a filtered signal, wherein said at least one bias-dependent capacitance remains substantially fixed in accordance with said dc bias signal, and said filtered signal includes an input dc signal component which corresponds to said input dc bias signal, and a filtered ac signal component which corresponds to said input ac signal; and an amplifier circuit, integrated within said semiconductor substrate and coupled to said at least one capacitive circuit element, configured to receive an output dc bias signal having a second dc magnitude which is proportional to said first dc magnitude, receive and amplify said filtered signal and subtract said output dc bias signal from said amplified filtered signal and in accordance therewith provide an output signal, wherein said output signal includes an output ac signal component which corresponds and is proportional to said input ac signal, and substantially zero output dc signal components which correspond to said input and output dc bias signals.

12. The apparatus of claim 11, wherein said at least one capacitive circuit element, said one or more external circuit elements and said amplifier circuit together comprise a current mirror circuit.

13. The apparatus of claim 11, wherein said input dc bias signal comprises a dc current.

14. The apparatus of claim 11, wherein said at least one capacitive circuit element and said one or more external circuit elements together comprise a low-pass filter circuit.

15. The apparatus of claim 11, wherein said output dc bias signal comprises a dc current.

16. The apparatus of claim 11, wherein said amplifier circuit comprises a differential amplifier.

17. The apparatus of claim 11, wherein said output signal comprises an ac current.

18. The apparatus of claim 11, further comprising, as said one or more external circuit elements, one or more resistive circuit elements configured to be connected to said plurality of circuit terminals.

19. The apparatus of claim 11, further comprising:

an input dc bias source, integrated within said semiconductor substrate, configured to provide an input dc current as said input dc bias signal; and an output dc bias source, integrated within said semiconductor substrate, configured to provide an output dc current as said output dc bias signal.

20. The apparatus of claim 11, further comprising an ac signal source, coupled to said filter circuit, configured to provide said input ac signal.

21. A method of performing compensated, bias-dependent signal filtration and amplification, said method comprising the steps of:

receiving an input dc bias signal having a first dc magnitude;

receiving an input ac signal;

filtering said input ac signal in accordance with a frequency response and in accordance therewith generating a filtered signal, wherein said frequency response is substantially fixed in accordance with said input dc bias signal, and wherein said filtered signal includes an input dc signal component which corresponds to said input dc bias signal, and a filtered ac signal component which corresponds to said input ac signal;

receiving an output dc bias signal having a second dc magnitude which is proportional to said first dc magnitude; and amplifying said filtered signal and in accordance therewith generating an amplified filtered signal; and subtracting said output dc bias signal from said amplified filtered signal and in accordance therewith generating an output signal, wherein said output signal includes an output ac signal component which corresponds and is proportional to said input ac signal, and substantially zero output dc signal components which correspond to said input and output dc bias signals.

22. The method of claim 21, wherein:

said step of receiving an input ac signal comprises receiving an input ac current; and said steps of receiving an input ac signal, filtering said input ac signal, amplifying said filtered signal and subtracting said output dc bias signal from said amplified filtered signal and in accordance therewith generating said output signal together comprise mirroring said input ac current.

23. The method of claim 21, wherein said step of receiving an input dc bias signal comprises receiving a dc current.

24. The method of claim 21, wherein said step of filtering said input ac signal comprises low-pass filtering said input ac signal.

25. The method of claim 24, wherein said step of low-pass filtering said input ac signal comprises low-pass filtering said input ac signal with an RC filter circuit which includes at least one capacitive circuit element integrated within said semiconductor substrate.

26. The method of claim 21, wherein said step of receiving an output dc bias signal comprises receiving a dc current.

27. The method of claim 21, wherein said step of subtracting said output dc bias signal from said amplified filtered signal and in accordance therewith generating an output signal comprises generating an ac current as said output signal.

28. The method of claim 21, further comprising the step of generating an ac current as said input ac signal.

* * * * *